(12) United States Patent
Deboy et al.

(10) Patent No.: US 8,031,498 B2
(45) Date of Patent: Oct. 4, 2011

(54) ACTIVE DIODE

(75) Inventors: Gerald Deboy, Klagenfurt (AT); Lutz Goergens, Villach (AT)

(73) Assignee: Infineon Technologies Austria AG, Villach (AT)

( * ) Notice: Subject to any disclaimer, the term of this patent is extended or adjusted under 35 U.S.C. 154(b) by 655 days.

(21) Appl. No.: 11/773,710

(22) Filed: Jul. 5, 2007

(65) Prior Publication Data
US 2009/0010033 A1    Jan. 8, 2009

(51) Int. Cl.
*H02M 7/217* (2006.01)
(52) U.S. Cl. ......................................... 363/127
(58) Field of Classification Search .......... 363/125–127; 327/313, 314, 325, 326, 419, 421
See application file for complete search history.

(56) References Cited

U.S. PATENT DOCUMENTS

| | | | | |
|---|---|---|---|---|
| 4,792,885 A | * | 12/1988 | Cuman et al. | 363/16 |
| 5,103,386 A | * | 4/1992 | Herrmann | 363/21.16 |
| 7,199,636 B2 | * | 4/2007 | Oswald et al. | 327/325 |
| 7,466,573 B2 | * | 12/2008 | Kojori et al. | 363/65 |
| 2009/0140707 A1 | * | 6/2009 | Deboy | 323/282 |

FOREIGN PATENT DOCUMENTS
JP    2003316452    *    4/2002

* cited by examiner

*Primary Examiner* — Adolf Berhane
(74) *Attorney, Agent, or Firm* — Dicke, Billig & Czaja, PLLC

(57) ABSTRACT

An active diode is disclosed. One embodiment provides a method for operating a device. The electronic device includes a transistor connected between a first and a second connection of the electronic device; a control device coupled to a control connection of the transistor; and an energy storage device coupled to the control device.

27 Claims, 2 Drawing Sheets

ACTIVE DIODE

BACKGROUND

The invention relates to an electronic device, in particular, an electronic device with two connections, and a method for operating such a device.

In prior art, a plurality of different electronic devices are known, e.g., diodes, transistors, thyristors, etc.

Diodes, for example, are devices that permit current to flow preferably in one direction.

Conventional diodes include two connections, namely the anode and the cathode.

If a positive voltage is applied between the anode and the cathode, the diode is operated in conducting direction—a "forward current" will then flow through the diode.

If a negative voltage is applied between the anode and the cathode, the diode locks. The current flowing through the diode in locking direction during operation of the diode in locking direction ("locking current") is in general substantially smaller than the current flowing in conducting direction during operation of the diode in conducting direction.

In many applications, it is necessary to convert an alternating current (AC) to a direct current (DC), a process known as rectification.

For this purpose, rectifiers are used. Rectifiers are e.g., applied as components of power supplies, as detectors of radio signals, etc.

As a rectifier, e.g., one single diode may be used. In this case, the difference between the term "diode" and the term "rectifier" is just one of usage, the term "rectifier" then merely describing a diode being applied to convert an alternating current (AC) to a direct current (DC).

To more efficiently convert AC to DC than possible with one single diode, rectifiers including several devices are used, e.g., rectifiers including several diodes in a specific arrangement, or one or several diodes together with one or several additional, different devices, such as transistors, operational amplifiers, etc.

Respective rectifiers/diodes to be used in such rectifiers e.g., are described in U.S. Pat. No. 6,271,712, US 2005/0122753, US 2005/0218964, and WO 02/084873 A1.

In general, conventional rectifiers that efficiently convert AC to DC have a structure that is relatively complex. Further, often, such conventional rectifiers use operational amplifiers, which in general need a relatively precise supply voltage to work properly. For these or other reasons, there is a need for the present invention.

SUMMARY

According to an embodiment of the invention, an electronic device includes a transistor connected between a first and a second connection of the electronic device, a control device coupled to a control connection of the transistor, and an energy storage device coupled to the control device. The control device e.g., may include a bias device, the bias device e.g., including a diode. The control device may in addition include a further transistor, the bias device being coupled to a control connection of the further transistor, and an additional transistor, the further transistor being coupled to a control connection of the additional transistor.

Further features and advantages of the present invention will become apparent from the following detailed description of the invention made with reference to the accompanying drawings.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Figure 1:
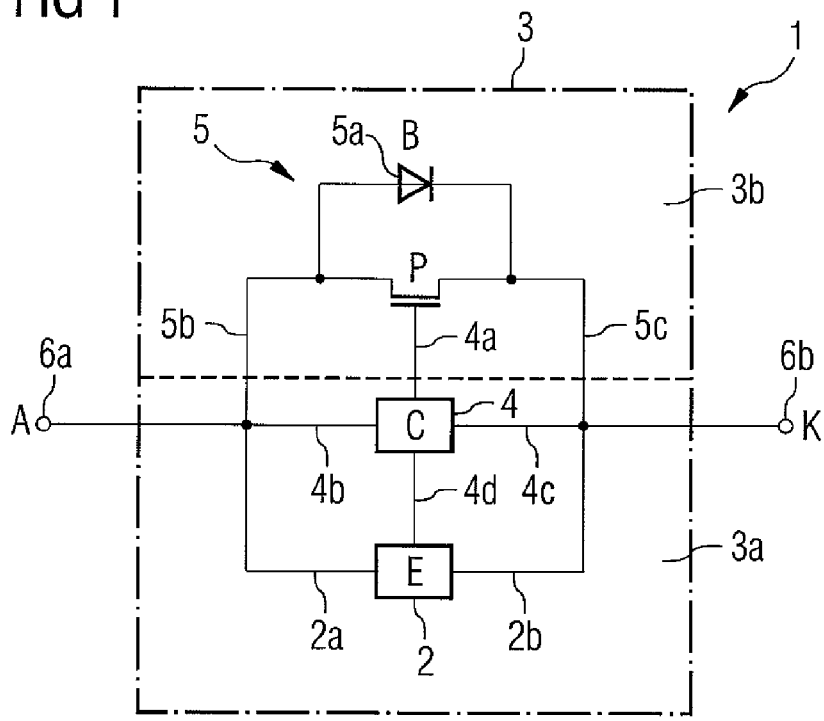
FIG. 1 illustrates a schematic, exemplary representation of an electronic device in accordance with one embodiment.

FIG. 1 illustrates a schematic, exemplary representation of an electronic device 1 in accordance with an embodiment of the invention.

In accordance with one embodiment, the electronic device 1 is arranged on a corresponding semiconductor chip 3.

Further, in accordance with the present specific embodiment, apart from the electronic device 1, no further electronic devices are arranged on the semiconductor chip 3.

In alternative, not illustrated embodiments, on the semiconductor chip 3, in addition to the electronic device 1, one or several further electronic devices may be arranged, such as (additional) transistors, etc., performing one or several additional functions different from the function performed by the electronic device illustrated in FIG. 1.

As will be described in further detail below, the electronic device 1 may e.g., perform the function of a diode, in particular, of an active diode.

The diode, in particular, active diode, e.g., may be applied as a rectifier, in particular, as a synchronous rectifier.

Hence, the electronic device 1 e.g., may be used to convert an alternating current (AC) to a direct current (DC) "rectification").

More generally speaking, additionally or alternatively, the electronic device 1 may be used for any (other) purpose for which a diode might be useful, e.g., radio modulation or demodulation, power conversion/power supplies, logic gates, etc.

As is illustrated in FIG. 1, the electronic device 1 includes an energy storage device 2 (here: an energy storage device E), a control device 4 (here: a control device C), and a transistor 5 (here: a power transistor P).

The energy storage device 2 (here: the energy storage device E), the control device 4 (here: the control device C), and the transistor 5 (here: the power transistor P) may be provided on one and the same semiconductor chip 3. Alternatively (as also schematically illustrated in FIG. 1 (here: by use of a dotted line)), e.g., the energy storage device 2 (here: the energy storage device E) and the control device 4 (here: the control device C) may be provided on a first semiconductor chip 3a, and e.g., the transistor 5 (here: the power transistor P) may be provided on a second, different semiconductor chip 3b, the two chips 3a, 3b e.g., providing for a respective "system in package".

The semiconductor chip 3 illustrated in FIG. 1 merely may include two external connections/pads (here: a first pad 6a, and a second pad 6b), which e.g., via respective bonding wires may be connected to respective (external) pins associated with the pads 6a, 6b, and provided at a respective semiconductor package into which the chip 3 is mounted.

The semiconductor package into which the chip 3 (or the above two separate chips 3a, 3b) is mounted e.g., may include exactly two pins (e.g., a first one connected with the pad 6a, and e.g., a second one connected with the pad 6b). In further, alternative embodiments, the semiconductor package may include more than the above two pins, e.g., three, four, eight or more pins. Correspondingly, in additional, alternative embodiments, and as will be described in further detail below, the semiconductor chip 3 may include more than the above two external connections/pads 6a, 6b, e.g., three or more external connections/pads, etc. (see e.g., FIG. 2, etc.).

When the electronic device 1 is used as a diode, the above first pad 6a e.g., may be used as "anode", and the above second pad 6b e.g., may be used as "cathode" of the diode.

As further illustrated in FIG. 1, the transistor 5, in particular power transistor 5 (as any typical conventional transistor) structurally-inherently includes a body diode 5a (here: a body diode B). Hence, the diode 5a illustrated in FIG. 1 is part of the above transistor 5, and therefore is not provided in the form of an additional, separate diode device.

The transistor 5 e.g., may be an n-channel MOSFET transistor. Alternatively, instead of an n-channel MOSFET transistor 5, a p-channel MOSFET transistor may be used, or e.g., a bipolar transistor, or any other suitable transistor.

As is illustrated in FIG. 1, the body diode 5a structurally-inherently comprised by the transistor 5 is provided between respective drain and source connections of the above MOSFET transistor (or respective emitter and collector connections of a respective bipolar transistor).

Further, in one or more embodiments, in addition to the above body diode 5a structurally-inherently comprised by the above transistor, a separate (additional) diode device separate from the transistor 5 may be provided (not illustrated in FIG. 1, and e.g., connected between the above drain and source connections of the above MOSFET transistor (or the respective emitter and collector connections of a respective bipolar transistor)).

As is illustrated in FIG. 1, a first one of the above drain or source connections (or the respective emitter or collector connections) of the transistor 5 is connected via e.g., a line 5b (or e.g., a respective wire) to the first pad 6a, and the other one of the above drain or source connections (or the respective emitter or collector connections) of the transistor 5 is connected via a line 5c (or e.g., a respective wire) to the above second pad 6b.

Further, a gate (or a respective base) connection of the transistor 5 is connected via a line 4a (or e.g., a respective wire) to a first connection of the control device 4.

As is further illustrated in FIG. 1, a second connection of the control device 4 is connected via a line 4b (or e.g., a respective wire) to the above first pad 6a (and hence also to the above first one of the above drain or source connections (or the respective emitter or collector connections) of the transistor 5).

Correspondingly similar, a third connection of the control device 4 is connected via a line 4c (or e.g., a respective wire) to the above second pad 6b (and hence also to the above other one of the above drain or source connections (or the respective emitter or collector connections) of the transistor 5).

Further, a fourth connection of the control device 4 is connected via a line 4d (or e.g., a respective wire) to a first connection of the energy storage device 2.

Still further, and as is also illustrated in FIG. 1, a second connection of the energy storage device 2 is connected via a line 2a (or e.g., a respective wire) to the above first pad 6a (and hence also to the above second connection of the control device 4, and the above first one of the above drain or source connections (or the respective emitter or collector connections) of the transistor 5).

In addition, a third connection of the energy storage device 2 is connected via a line 2b (or e.g., a respective wire) to the above second pad 6b (and hence also to the above third connection of the control device 4, and the above other one of the above drain or source connections (or the respective emitter or collector connections) of the transistor 5).

The energy storage device 2—as e.g., illustrated in FIG. 3—e.g., may include a capacitor 2c, and—optionally—one or several additional components (in the following called "other parts of the energy storage device").

Figure 3:
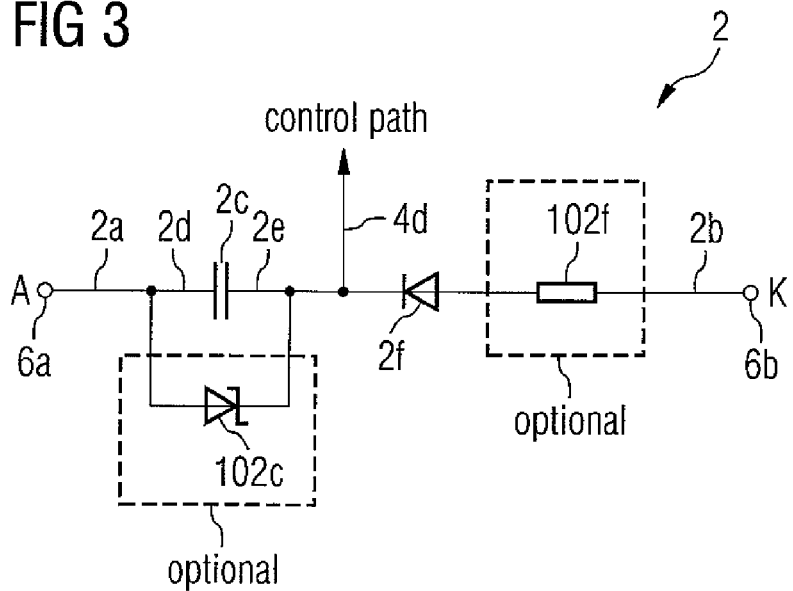
FIG. 3 illustrates a more detailed circuit diagram of a portion of the electronic devices illustrated in FIGS. 1 and 2 in accordance with several embodiments.

As is illustrated in FIG. 3, the other parts of the energy storage device 2 e.g., may include a diode 2f.

A cathode of the diode 2f may be connected via a line 2e to the capacitor 2c, and via the above line 4d to the above fourth connection of the control device 4.

Further, an anode of the diode 2f may be connected via the above line 2b to the above second pad 6b of the semiconductor chip 3.

As is illustrated in FIG. 1, the capacitor 2c of the energy storage device 2 e.g., may in a monolithic way be integrated into/onto the silicon of the semiconductor chip 3 (or the above semiconductor chip 3a), e.g., correspondingly similar as/together with the control device 4, and/or the transistor 5, and/or the other parts of the energy storage device 2 (e.g., the above diode 2f).

In this case, and as is e.g., illustrated in FIG. 3, a first connection of the capacitor 2c e.g., may be connected via a line 2d, and the above line 2a to the above first pad 6a of the semiconductor chip 3, and a second connection of the capacitor 2c e.g., may be connected via the line 2e, and the above line 4d to the above fourth connection of the control device 4.

Instead of by use of the above (monolithic) integration of the above capacitor 2c in the respective silicon layer(s), the capacitor 2c e.g., also may be produced using other suitable technologies, e.g., "chip on chip" technologies, or e.g., "chip by chip" technologies, by use of which respective capacitive elements (here: the above capacitor 2c) may be realized in silicon. Thereby, for example, the tube etching technology of Lehmann ("Lehmann'sche Röhrenätztechnik") may be applied. A corresponding method for building a respective chip capacitor 2c e.g., is described in the German Patent Application DE 3717851 of Mr. Lehmann, the contents of which is incorporated herein by reference in its entirety.

In case of e.g., using the above "chip on chip" technology for producing the capacitor 2c, the capacitor 2c is provided on a chip separate from the semiconductor chip 3 on which the above control device 4, and/or the transistor 5, and/or the other parts of the energy storage device 2 (if any) are provided. In this case, for instance, a first pad of the chip on which the capacitor 2c is provided may be connected via a further pad of the semiconductor chip 3, and the above line 2a to the above first pad 6a of the semiconductor chip 3, and a second pad of the chip on which the capacitor 2c is provided may be connected via a still further pad of the semiconductor chip 3, and the above line 4d to the above fourth connection of the control device 4.

Still further, the capacitor 2c e.g., may be provided in the form of a separate SMD component, e.g., in the form of a respective SMD capacitor 2c provided in the same (semiconductor) package, as the semiconductor chip 3.

For instance, an SMD capacitor 2c may be used which is mounted directly to the substrate of the above semiconductor chip 3 (into/onto which the above control device 4, and/or the transistor 5, and/or the other parts of the energy storage device 2 (if any) are integrated). In this case, e.g., a respective mould compound package may be used, for example, a Mega-DIP package.

In case of using an SMD capacitor 2c, for instance, a first connection of the SMD capacitor may be connected via a further pad of the semiconductor chip 3, and the above line 2a to the above first pad 6a of the semiconductor chip 3, and a second connection of the SMD capacitor may be connected via a still further pad of the semiconductor chip 3, and the above line 4d to the above fourth connection of the control device 4.

Figure 2:
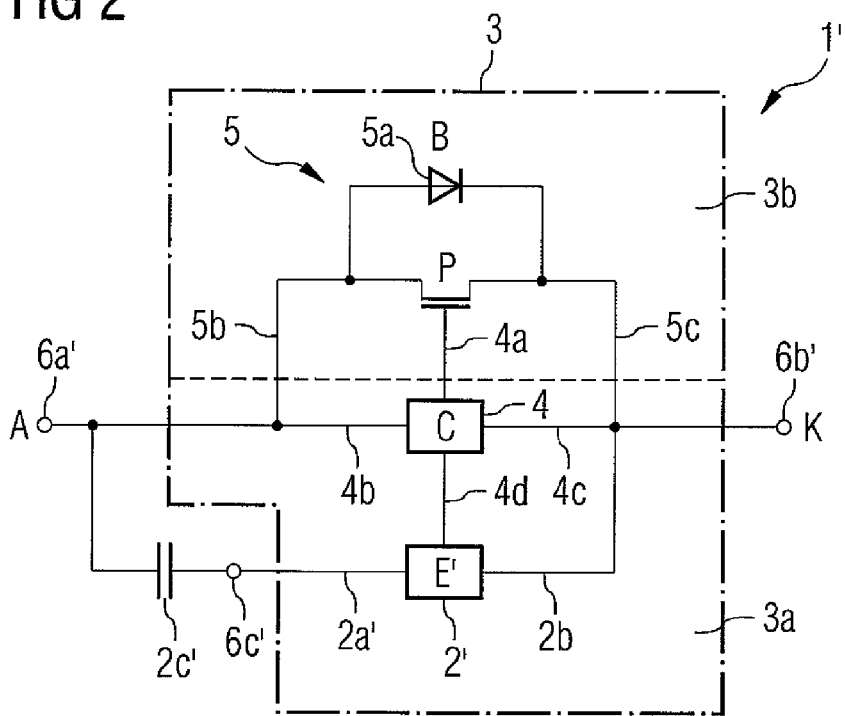
FIG. 2 illustrates a schematic, exemplary representation of an electronic device in accordance with one embodiment.

As illustrated in FIG. 2, instead of providing the capacitor 2c in the same (semiconductor) package, as the semiconductor chip 3 (or the semiconductor chips 3a, 3b), in further, alternative embodiments, the capacitor 2c—more particularly: a capacitor enumerated with a reference number 2c' in FIG. 2—may be provided in a different package, than the semiconductor chip 3 or chips 3a, 3b (into/onto which e.g., the control device 4, and/or the transistor 5, and/or the above other parts of the energy storage device (enumerated with a reference number 2' in FIG. 2) are integrated).

The above other parts of the energy storage device 2', the control device 4, and the transistor 5 may be provided on one and the same semiconductor chip 3. Alternatively (as also schematically illustrated in FIG. 2 (here: by use of a dotted line)), e.g., the other parts of the energy storage device 2' and the control device 4 may be provided on a first semiconductor chip 3a, and e.g., the transistor 5 may be provided on a second, different semiconductor chip 3b, the two chips 3a, 3b e.g., providing for a respective "system in package".

The semiconductor chip 3 according to FIG. 2 includes three (or more) external connections/pads (here: a first pad 6a', a second pad 6b', and a third pad 6c'), which e.g., via respective bonding wires may be connected to respective (external) pins associated with the pads 6a', 6b', 6c', and provided at a respective semiconductor package into which the chip 3—but not the capacitor 2c'—is mounted. The semiconductor package into which the chip 3 is mounted e.g., may include exactly three pins (e.g., a first one connected with the first pad 6a', a second one connected with the second pad 6b', and a third one connected with the third pad 6c'). In further, alternative embodiments, the semiconductor package may include more than the above three pins, e.g., four, eight or more pins. Correspondingly, in additional, alternative embodiments, the semiconductor chip 3 includes more than the above three external connections/pads 6a', 6b', 6c', e.g., four or more external connections/pads, etc.

As illustrated in FIG. 2, and correspondingly similar as in the embodiment illustrated in FIG. 1, the transistor 5, in particular power transistor 5 structurally-inherently includes a body diode 5a.

The transistor 5 illustrated in FIG. 2 correspondingly similar as in the embodiment illustrated in FIG. 1 e.g., may be an n-channel MOSFET transistor. Alternatively, instead of an n-channel MOSFET transistor 5, a p-channel MOSFET transistor may be used, or e.g., a bipolar transistor, or any other suitable transistor.

As is illustrated in FIG. 2, a first one of the respective drain or source connections (or the respective emitter or collector connections) of the transistor 5 is connected via a line 5b to the first pad 6a' of the semiconductor chip 3, and the other one of the above drain or source connections (or the respective emitter or collector connections) of the transistor 5 is connected via a line 5c to the above second pad 6b' of the semiconductor chip 3.

Further, a gate (or a respective base) connection of the transistor 5 is connected via a line 4a to a first connection of the control device 4.

As is further illustrated in FIG. 2, a second connection of the control device 4 is connected via a line 4b to the above first pad 6a' of the semiconductor chip 3, and a third connection of the control device 4 is connected via a line 4c to the above second pad 6b' of the semiconductor chip 3.

Further, and as will be described in more detail below, a fourth connection of the control device 4 is connected via a line 4d to a first connection of the above other parts of the energy storage device 2'.

Still further, and as is also illustrated in FIG. 2, a second connection of the other parts of the energy storage device 2' is connected via a line 2a' to the above third pad 6c' of the semiconductor chip 3.

In addition, a third connection of the other parts of the energy storage device 2' is connected via a line 2b to the above second pad 6b' of the semiconductor chip 3.

In more detail, and correspondingly similar as described in connection with FIG. 3 above, the other parts of the energy storage device 2' e.g., may include a diode 2f.

In this case, e.g., a cathode of the diode 2f may be connected via the above line 4d to the above fourth connection of the control device 4, and via the above line 2a' to the above third pad 6c' of the semiconductor chip 3.

Further, an anode of the diode 2f may be connected via the above line 2b to the above second pad 6b' of the semiconductor chip 3.

As the above, in the embodiment illustrated in FIG. 2, the capacitor 2c' may be provided external from the package in which the semiconductor chip 3 is provided (hence, in a respective external package).

A first connection of the capacitor 2c' may be connected with the above first (external) pin of the package of the semiconductor chip (and hence, the above first pad 6a'), and a second connection of the capacitor 2c' may be connected with the above third (external) pin of the package of the semiconductor chip (and hence, the above third pad 6c').

The (external) capacitor 2c', and the rest of the energy storage device 2' according to the alternative embodiment of an electronic device illustrated in FIG. 2 (enumerated with a reference number 1' in FIG. 2) in common may perform the same or a corresponding function, as the energy storage device 2 of the electronic device 1 illustrated in FIG. 1.

As will be described in further detail below, the energy storage device 2 illustrated in FIG. 1/the capacitor 2c' together with the rest of the storage device 2' illustrated in FIG. 2 may obtain energy in respective first phases of the operation of the respective electronic device 1, 1' where the respective transistor 5 is locked, i.e., non-conducting (operation of the electronic device in locking direction), and where a locking voltage is present between the first and second pads 6b, 6b' (cathode potential relative to anode potential).

For this purpose, as the above, the respective capacitor 2c, 2c' is connected with the respective first pad 6a, 6a' of the semiconductor chip 3, used as "anode", and—via the respective diode 2f—with the respective second pad 6b, 6b' of the semiconductor chip 3, used as "cathode".

As becomes clear from what was the above, the diode 2f in the above first phases, where the respective transistor 5 is locked, and where the above locking voltage is present between the first and second pads 6b, 6b', is conducting, such that the respective capacitor 2c, 2c' is loaded.

Inversely, the diode 2f in respective second phases of the operation of the electronic device 1, 1' (succeeding the above first phases) is locked.

As will be described in further detail below, during the above second phases (succeeding the above first phases) the respective capacitor 2c, 2c' is de-loaded, helping to turn on the transistor 5, i.e., make the transistor 5 conducting (operation of the electronic device in conducting direction).

As is illustrated in FIG. 3, and in accordance with further, alternative embodiments, an additional (serial) resistor 102f may be provided between the anode of the diode 2f, and the respective second pad 6b, 6b' of the semiconductor chip 3. Thereby, for instance, the rush-in current during the above first phases may be reduced.

Alternatively or additionally, and as also illustrated in FIG. 3, in parallel to the respective capacitor 2c, 2c', a Zener diode 102c may be provided.

Thereby, for example, the (maximum) voltage across the respective capacitor 2c, 2c' may be limited, e.g., to a maximum voltage of between 15V to 50V, in particular, e.g., to a maximum voltage of between 20V to 30V, etc. Hence, a suitable voltage limitation of the voltage across the capacitor 2c, 2c' may be achieved. For this purpose, instead of or in addition to the Zener diode 102c, other suitable voltage limitation devices may be applied.

According to a specific example, the Zener diode 102c, and/or the serial resistor 102f, and/or the capacitor 2c, 2c' may be dimensioned such that the energy stored on the respective capacitor 2c, 2c' in the course of the above first phases is sufficient to turn on the transistor 5 during the above (succeeding) second phases by respectively de-loading the capacitor 2c, 2c' to a voltage of e.g., between 8V to 12V, e.g., approximately 10V. Additionally (or alternatively), the Zener diode 102c, and/or the serial resistor 102f, and/or the capacitor 2c, 2c' may be dimensioned such that respective leakage currents are minimized.

According to further alternative embodiments, and as will be described in further detail below, a suitable voltage limitation instead of or in addition to the above voltage limitation regarding the voltage across the capacitor 2c, 2c', and e.g., achieved by the Zener diode 102c e.g., also may be provided in the control path of the respective electronic device 1, 1', illustrated in FIG. 3. In this case, alternatively, the Zener diode 102c may be omitted.

Figure 4:
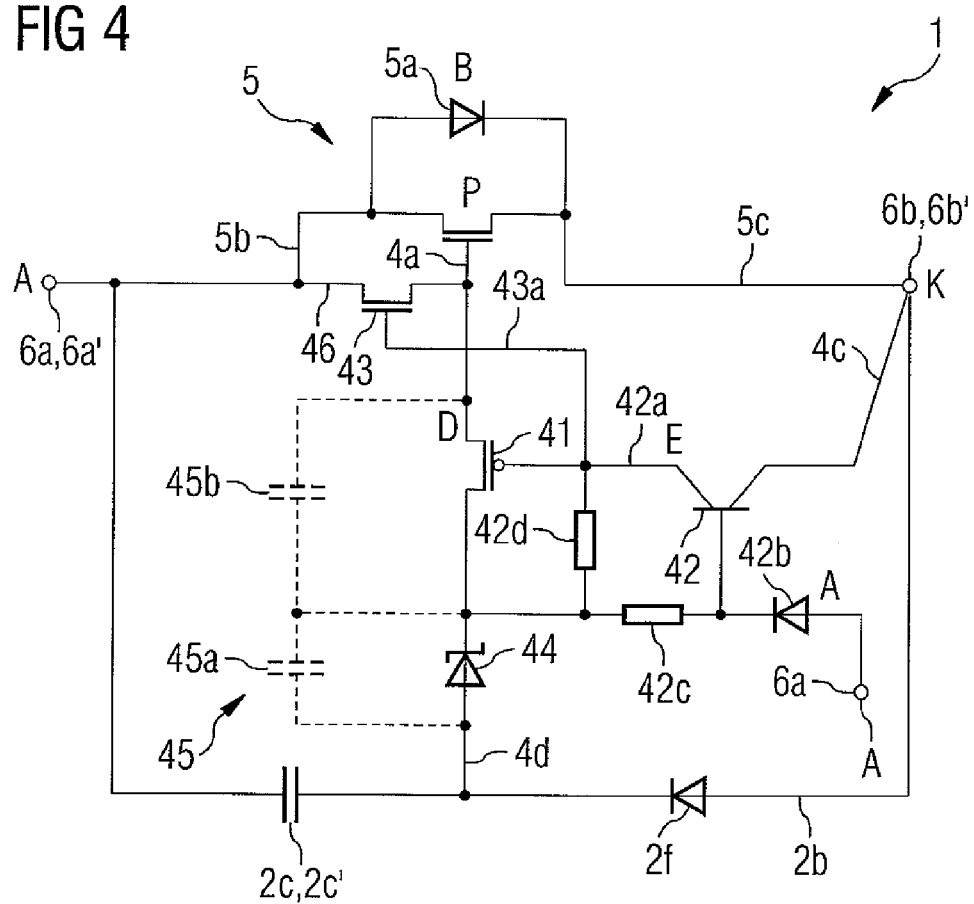
FIG. 4 illustrates a more detailed circuit diagram of an embodiment of the electronic devices illustrated in FIGS. 1 and 2.

FIG. 4 illustrates a more detailed circuit diagram of an embodiment of the electronic devices 1, 1' illustrated in FIGS. 1 and 2.

As can be seen in FIG. 4, the control device 4 of the electronic devices 1, 1' e.g., may include a first transistor 41, here: a p-channel MOSFET transistor, a second transistor 42, e.g., a respective a bipolar transistor (here: an npn bipolar transistor), and a third transistor 43, here: an n-channel MOSFET transistor.

As is further illustrated in FIG. 4, a first connection of the first transistor 41 (here: the drain connection of the p-channel MOSFET transistor) via the line 4a is connected with the gate connection of the above transistor 5 (here: the power transistor P).

Further, a second connection of the first transistor 41 (here: the source connection of the p-channel MOSFET transistor) via the line 4d is connected with the energy storage device 2, 2' (here: the capacitor 2c, 2c' and the diode 2f).

Alternatively, and as illustrated in FIG. 4, a Zener diode 44 may be provided between the second connection of the first transistor 41 (here: the source connection of the p-channel MOSFET transistor) and the energy storage device 2, 2'. The Zener diode might serve to achieve a suitable voltage limitation. For this purpose, instead of or in addition to the Zener diode 44, other suitable voltage limitation devices may be applied, e.g., a linear regulation device.

For example, by use of the Zener diode 44 and/or the other suitable voltage limitation devices, the voltage at the gate connection of the transistor 5 may be limited to a maximum voltage of e.g., between 15V to 50V, in particular, e.g., to a maximum voltage of between 20V to 30V.

According to a further alternative embodiment (see dotted lines in FIG. 4), a capacitive voltage divider 45 may be provided in parallel to the above first transistor 41 (here: the p-channel MOSFET transistor) and the Zener diode 44. The capacitive voltage divider 45 e.g., may include a first capacitor 45a, and a second capacitor 45b. A first connection of the first capacitor 45a is connected with the above line 4d, and hence, the energy storage device 2. Further, a second connection of the first capacitor 45a is connected with a first connection of the second capacitor 45b, the second connection of the first transistor 41 (here: the source connection of the p-channel MOSFET transistor), and the Zener diode 44. In addition, a second connection of the second capacitor 45b is connected with the first connection of the first transistor 41 (here: the drain connection of the p-channel MOSFET transistor), and the gate connection of the transistor 5.

As is further illustrated in FIG. 4, a first connection of the second transistor 42 (here: the emitter connection of the above bipolar transistor) is connected via a line 42a with the gate connection of the first transistor 41 (here: the above p-channel MOSFET transistor), such that the gate of the p-channel MOSFET transistor 41 is controlled by the bipolar transistor 42.

A second connection of the second transistor 42 (here: the collector connection of the above bipolar transistor) is connected via the line 4c with the above second pad 6b of the chip, i.e., the "cathode".

As is further illustrated in FIG. 4, a voltage present at the base connection of the second transistor 42 may be biased with a positive voltage, e.g., by use of a diode 42b, connected in series with a resistor 42c.

By suitably biasing the voltage present at the base connection of the second transistor 42, a "reference voltage" or "threshold voltage" may be adjusted which determines at what voltage the second transistor 42 (and hence, also the first transistor 41, and the power transistor 5, i.e., the electronic device 1, 1') is turned on.

In more detail, and as can be seen in FIG. 4, a first connection of the diode 42b (here: the cathode of the diode 42b) may be connected with the base connection of the second transistor 42, and a second connection of the diode 42b (here: the anode of the diode 42b) may be connected with the above first pad 6a of the chip 3, i.e., the "anode" of the chip 3. Hence, it might be achieved that the second transistor 42 (and hence, also the first transistor 41, and the power transistor 5, i.e., the electronic device 1, 1') is turned on not at a voltage of about −0.7V (as would be the case without diode 42b), but at a voltage of about 0V.

Instead of the above diode 42b (which e.g., is a silicon junction/silicon depletion layer diode with a forward voltage of e.g., about 0.7V) e.g., a Schottky barrier diode (with a forward voltage of e.g., about 0.5V) may be used. In this case, the second transistor 42 (and hence, also the first transistor 41, and the power transistor 5, i.e., the electronic device 1, 1') is turned on at a voltage of about −0.2V. In a further alternative embodiment, the base connection of the second transistor 42 might be directly connected with the above first pad 6a of the chip. As in this case the voltage present at the base connection of the second transistor 42 is not biased, the second transistor 42 (and hence, also the first transistor 41, and the power transistor 5, i.e., the electronic device 1, 1') then is turned on at a voltage of about −0.7V.

Again referring to FIG. 4, a first connection of the above resistor 42c is connected with the cathode of the diode 42b, and the base connection of the second transistor 42. Further, a second connection of the resistor 42c is connected with the second connection of the first transistor 41 (here: the source connection of the p-channel MOSFET transistor), and a first connection of a further resistor 42d. As can be seen in FIG. 4 also, a second connection of the resistor 42d is connected with the gate connection of the first transistor 41 (here: the p-channel MOSFET transistor), and the first connection of the second transistor 42 (here: the emitter connection of the above bipolar transistor).

As becomes clear from what was the above, the first transistor 41 (here: the p-channel MOSFET transistor) is turned on via the second transistor 42 (here: the above bipolar transistor) when the second transistor 42 is turned on, and turned off via the resistor 42d, which as can be seen from FIG. 4 is referenced to the (positive) source voltage present at the source connection of the p-channel MOSFET transistor 41.

When the first transistor 41 is turned on, a current might flow from the energy storage device 2, 2' to the gate connection of the power transistor 5, such that the power transistor 5 is turned on.

The power transistor 5 may e.g., be turned off via a respective pull-down resistor at anode potential, or alternatively— as is illustrated in FIG. 4—e.g., may be turned off via a respective totem-pole circuit. The totem-pole circuit e.g., may include the third transistor 43 (here: the above n-channel MOSFET transistor).

The source-drain path of the third transistor 43 (here: the above n-channel MOSFET transistor) is connected between the above first pad 6a of the chip 3, i.e., the "anode", and the gate connection of the power transistor 5. Further, the gate connection of the third transistor 43 (here: the above n-channel MOSFET transistor) is connected via a line 43a to the emitter connection of the above bipolar transistor 42, the gate connection of the p-channel MOSFET transistor 41, and the resistor 42d.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An electronic device comprising:
 a first transistor connected between a first and a second connection of the electronic device;
 a control device coupled to a control connection of the first transistor to control the first transistor; and
 an energy storage device comprising a capacitor and a diode coupled between the first and second connections, wherein the control device comprises a control device transistor, and wherein the control device comprises a voltage limitation device directly coupled to a source or drain of the control device transistor and coupled to a node between the capacitor and the diode to limit a voltage at the control connection of the first transistor controlled by the control device.

2. The electronic device of claim 1, wherein the control device transistor is a MOSFET transistor and wherein the control device comprises the MOSFET transistor and a second control device transistor.

3. The electronic device of claim 2, wherein the second control device transistor is connected between a control connection of the MOSFET transistor and the first or second connection of the electronic device.

4. The electronic device of claim 3, further comprising:
 a bias device connected between a control connection of the second control device transistor and the first or second connection of the electronic device.

5. The electronic device of claim 4, wherein the bias device comprises a diode.

6. The electronic device of claim 5, wherein the diode of the bias device is a silicon junction/silicon depletion layer diode.

7. The electronic device of claim 5, wherein the diode of the bias device is a Schottky barrier diode.

8. The electronic device of claim 1, wherein the voltage limitation device comprises a Zener diode.

9. The electronic device of claim 1, wherein the control device comprises the control device transistor, the voltage limitation device, and a first and a second capacitor, the first capacitor coupled across the control device transistor, and the second capacitor coupled across the voltage limitation device.

10. The electronic device of claim 1, wherein the control device comprises a totem-pole circuit.

11. The electronic device of claim 10, wherein the totem-pole circuit comprises a totem-pole circuit transistor connected between the first connection of the electronic device and the control connection.

12. The electronic device of claim 1, wherein the first transistor, the control device and the energy storage device are provided on one and the same semiconductor chip.

13. The electronic device of claim 1, wherein the first transistor and the control device are provided on one and the same semiconductor chip, and the capacitor is provided external from the semiconductor chip.

14. The electronic device of claim 1, wherein the first transistor, the control device and the energy storage device are provided in one and the same package.

15. The electronic device of claim 1, wherein the first transistor and the control device are provided in one and the same package, and the capacitor is provided external from the package.

16. An electronic device comprising:
- a first transistor connected between a first and a second connection of the electronic device;
- an energy storage device comprising a capacitor and a diode connected between the first and second connections; and
- a control device connected between a control connection of the first transistor and the energy storage device, wherein the control device comprises a control device transistor, and wherein the control device comprises a voltage limitation device directly coupled to a source or drain of the control device transistor and coupled to a node between the capacitor and the diode to limit a voltage at the control connection of the first transistor.

17. The electronic device of claim 16, wherein the control device comprises a bias device.

18. The electronic device of claim 17, the bias device comprising a diode.

19. The electronic device of claim 17, the control device further comprising a bipolar transistor coupled to the bias device.

20. The electronic device of claim 19, wherein the control device transistor is a MOSFET transistor that is coupled to the bipolar transistor.

21. The electronic device of claim 17, the energy storage device and the control device adapted such that the first transistor is turned on when a voltage between the first and second connection is bigger than a predetermined threshold, and turned off when the voltage between the first and second connection is equal or smaller than the predetermined threshold, the threshold being determined by the bias device.

22. The electronic device of claim 17, the energy storage device and the control device adapted such that the first transistor is turned off when a voltage between the first and second connection is bigger than a predetermined threshold, and turned on when the voltage between the first and second connection is equal or smaller than the predetermined threshold, the threshold being determined by the bias device.

23. A method for operating an electronic device, the method comprising:
- providing an electronic device comprising a switching device connected between a first and a second connection of the electronic device, an energy storage device, and a control device connected to a control connection of the switching device to control the switching device, wherein the energy storage device comprises a capacitor and a diode connected between the first and second connections, and wherein the control device comprises a control device transistor, and wherein the control device comprises a voltage limitation device directly coupled to a source or drain of the control device transistor and coupled to a node between the capacitor and the diode to limit a voltage at the control connection of the switching device;
- bringing the switching device into a first state when a voltage between the first and second connection is bigger than a predetermined threshold; and
- bringing the switching device into a second state different from the first state when the voltage between the first and second connection is equal or smaller than the predetermined threshold.

24. The method of claim 23, the threshold being determined by a bias device.

25. The method of claim 24, the control device comprising a further transistor, the bias device being coupled to a control connection of the further transistor.

26. The method of claim 25, the control device comprising an additional transistor, the further transistor being coupled to a control connection of the additional transistor.

27. An electronic device comprising:
- a first transistor connected between a first and a second connection of the electronic device;
- an energy storage device comprising a capacitor and a diode coupled between the first and second connections; and
- means connected between a control connection of the first transistor and the energy storage device for turning the first transistor on and off based upon the relative voltages of the first and second connections and a predetermined threshold, wherein the means for turning the first transistor on and off comprises a second transistor and further comprises a voltage limitation device directly coupled to a source or drain of the second transistor and coupled to a node between the capacitor and the diode to limit a voltage at the control connection of the first transistor.

* * * * *